(12) United States Patent
Bougrov et al.

(10) Patent No.: US 8,198,648 B2
(45) Date of Patent: Jun. 12, 2012

(54) LIGHT EMITTING DIODE CHIP

(75) Inventors: Vladislav E. Bougrov, Espoo (FI); Maxim A. Odnoblvudov, Espoo (FI)

(73) Assignee: Optogan Oy, Espoo (FI)

( * ) Notice: Subject to any disclaimer, the term of this patent is extended or adjusted under 35 U.S.C. 154(b) by 38 days.

(21) Appl. No.: 12/667,330

(22) PCT Filed: Jun. 9, 2008

(86) PCT No.: PCT/FI2008/050338
§ 371 (c)(1),
(2), (4) Date: Dec. 30, 2009

(87) PCT Pub. No.: WO2008/155452
PCT Pub. Date: Dec. 24, 2008

(65) Prior Publication Data
US 2010/0163910 A1    Jul. 1, 2010

(30) Foreign Application Priority Data
Jun. 20, 2007 (FI) ................................ 20070496

(51) Int. Cl.
*H01L 33/00* (2010.01)
(52) U.S. Cl. ..................... 257/98; 257/99; 257/100
(58) Field of Classification Search ............. 257/91, 257/81, 84, 88, 93, 94, 99, 690, 698, 700
See application file for complete search history.

(56) References Cited

U.S. PATENT DOCUMENTS

| 6,518,598 | B1 * | 2/2003 | Chen .............................. 257/91 |
| 2003/0091085 | A1 * | 5/2003 | Northrup et al. ................. 372/50 |
| 2003/0230754 | A1 | 12/2003 | Steigerwald et al. |
| 2004/0061123 | A1 * | 4/2004 | Shelton et al. ................... 257/99 |
| 2004/0084684 | A1 * | 5/2004 | Tarsa et al. ....................... 257/91 |
| 2004/0089861 | A1 | 5/2004 | Chen et al. |
| 2005/0133806 | A1 | 6/2005 | Peng et al. |
| 2005/0225973 | A1 | 10/2005 | Eliashevich et al. |
| 2006/0011935 | A1 | 1/2006 | Krames et al. |
| 2006/0244005 | A1 | 11/2006 | Chen |

FOREIGN PATENT DOCUMENTS

| GB | 2343994 | 5/2000 |
| JP | 2002280618 | 9/2002 |
| WO | WO 2006019180 | 2/2006 |

* cited by examiner

*Primary Examiner* — Wai Sing Louie
*Assistant Examiner* — Bilkis Jahan
(74) *Attorney, Agent, or Firm* — Fay Sharpe LLP

(57) ABSTRACT

An LED chip (1) grown on an electrically insulating substrate (4) comprises a lower current-distributing layer (5) of a first conductivity type, a first electrode (2), a vertical layer structure (5, 6, 7), the last two being formed on the lower current-distributing layer horizontally separated from each other, the vertical layer structure comprising an active layer (6) and an upper current-distributing layer (8) of a second conductivity type above the active layer, and a second electrode (3) formed on the upper current-distributing layer, the geometry of the electrodes being adjusted to provide a horizontal distance between the electrodes lower than the current spreading length of the chip. According to the present invention, a vertical trench (9) is formed between the electrodes (2, 3), the trench extending through the chip (1), including the lower current-distributing layer (5), for controlling the horizontal current flow in order to achieve a uniform current density over the active layer (6).

3 Claims, 3 Drawing Sheets

LIGHT EMITTING DIODE CHIP

FIELD OF THE INVENTION

The present invention relates to a light-emitting diode (LED) chip design, the LED being grown on an insulating substrate.

BACKGROUND OF THE INVENTION

In an LED grown as a layer structure on an insulating substrate, both n- and p-contact electrodes are made from the top side of the chip. Normally they are located near the opposite edges of the light-generating region of the chip. One of them is formed on a lower current-distributing layer exposed by selectively etching away the layers grown on it and the other on an upper current-distributing layer on top of the LED layer structure.

In a typical case, the horizontal distance between the electrodes is much higher than the overall thickness of the vertical layer structure of the LED. In that case, to provide a high current uniformity over the light-generating layer, the sheet resistances of the current-distributing layers should be as low as possible in order to minimize voltage drop along those layers. Particularly, the sheet resistances should be outstandingly smaller than the average vertical resistance through the layer structure (including e.g. resistance due to voltage drop in the p-n junction). However, in most practical cases, said sheet resistances produce substantial voltage drops along the current-distributing layers. This leads to a non-uniform current density resulting possibly in local overheating at the high current density sites. This local overheating can further result in a drop in the device efficiency, as well as in degraded device reliability.

A characteristic parameter relating to the current uniformity is the current spreading length:

$$L_s = \sqrt{\frac{\rho_{vertical}}{\rho_{sheet,top} + \rho_{sheet,bottom}}},$$

where $\rho_{vertical}$ is the average vertical resistance through the LED structure and $\rho_{sheet, top}$ and $\rho_{sheet, bottom}$ are the sheet resistances of top and bottom current-distributing layers. In order to avoid the above-described voltage drop along the current spreading layers, the horizontal distance between the electrodes should be lower than the current spreading length. The problem is that, in most practical cases, the horizontal chip dimensions are clearly higher than the current spreading length. Thus, with conventional simple contact pads, said condition relating to the distance between the electrodes can not be fulfilled. One known solution for this problem is using a finger-like, i.e. an interdigitated electrode geometry. With this kind of geometry, the horizontal distances between the electrodes can be adjusted smaller than the current spreading length. However, also this approach has its deficiencies: current density is always highest near the electrodes, particularly at the outer ends of the electrode "fingers", resulting in a significantly non-uniform current density.

PURPOSE OF THE INVENTION

The purpose of the present invention is to provide an LED chip design improving the performance and reliability of the component through an improved current uniformity over the light-generating region of the chip.

SUMMARY OF THE INVENTION

The present invention is characterized by what is presented in claim 1.

The LED chip of the present invention is grown on an electrically insulating substrate. The LED structure comprises a lower current-distributing layer of a first conductivity type, a first electrode, and a vertical layer structure, the last two being formed on the lower current-distributing layer laterally separated from each other. The vertical layer structure comprises an active layer preferably sandwiched between an n-type and a p-type semiconductor cladding layer, and an upper current-distributing layer of a second conductivity type above the active layer. A second electrode is formed on the upper current-distributing layer. The geometry of the electrodes is adjusted to provide a horizontal distance between the electrodes lower than the current spreading length of the chip. The term "horizontal" herein means a direction within the plane of the substrate and "vertical", naturally, a direction perpendicular to this plane.

According to the present invention, a vertical trench is formed between the electrodes, the trench extending through the chip, including the lower current-distributing layer, for controlling the horizontal current flow in the current-distributing layers in order to achieve a uniform current density over the active layer. In other words, in contrast to the prior art solutions where the current flow is controlled by the geometries of the electrodes and the vertical layer structure above the lower current-distributing layer only, in the present invention also the lower current distribution is selectively cut off. Thus, instead of the two-level approach of the prior art solutions, the chip topology is based on three levels. By controlling the current flow by excluding all layers from selected sites of the chip geometry, a unidirectional current flow and a very uniform current density over the entire light-generating layer can be achieved.

In addition to the current guiding effect, trenches described above increase the overall perimeter of the vertical layer structure. This produces an increased probability for light generated in the active layer to escape from the structure through the side walls of the vertical layer structure. For further enhancing the light extraction from the chip, in a preferred embodiment of the present invention an additional vertical trench is formed between the electrodes, the additional trench extending through the chip, including the active layer, along the horizontal direction of current flow in the current-distributing layers for further increasing the overall perimeter of the vertical layer structure. Additional trenches positioned along the current flow direction do not disturb the current flow.

One problem in having an interdigitated or similar chip geometry is that the light extracted from the chip through the side wall of the vertical layer structure can be blocked by an opposite side wall or by the first electrode on the lower current-distributing layer. For avoiding this, a side wall of the vertical layer structure is preferably tilted, at least at the light-generating active layer, from the vertical direction for facilitating the light extraction from the chip.

BRIEF DESCRIPTION OF THE DRAWINGS

In the following, the present invention will be described in more detail with references to the accompanying figures, in which.

DETAILED DESCRIPTION OF THE INVENTION

Figure 1:
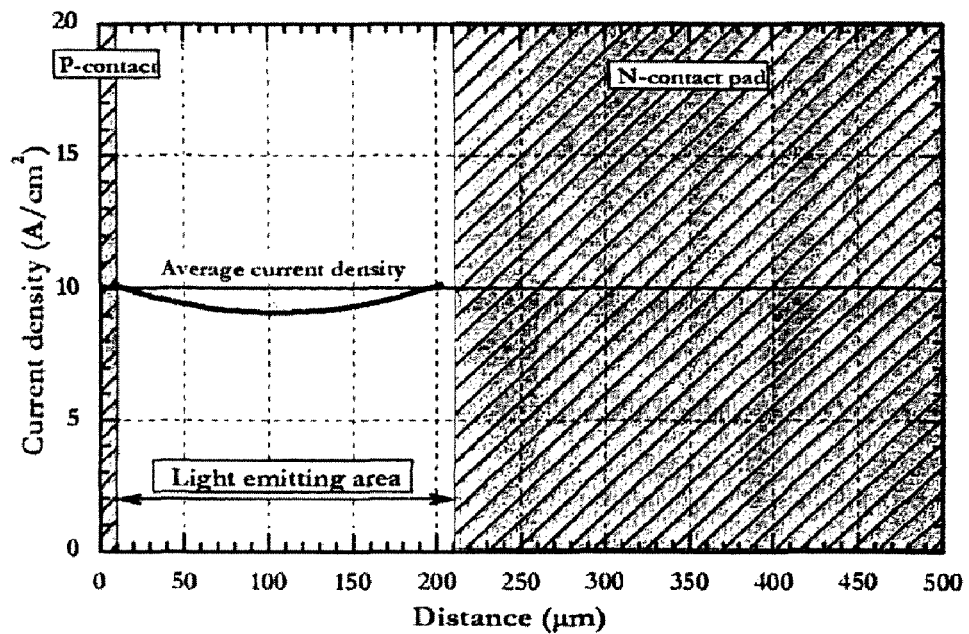
FIG. 1 shows examples of the current density in conventional LED chips.
Figure 1:
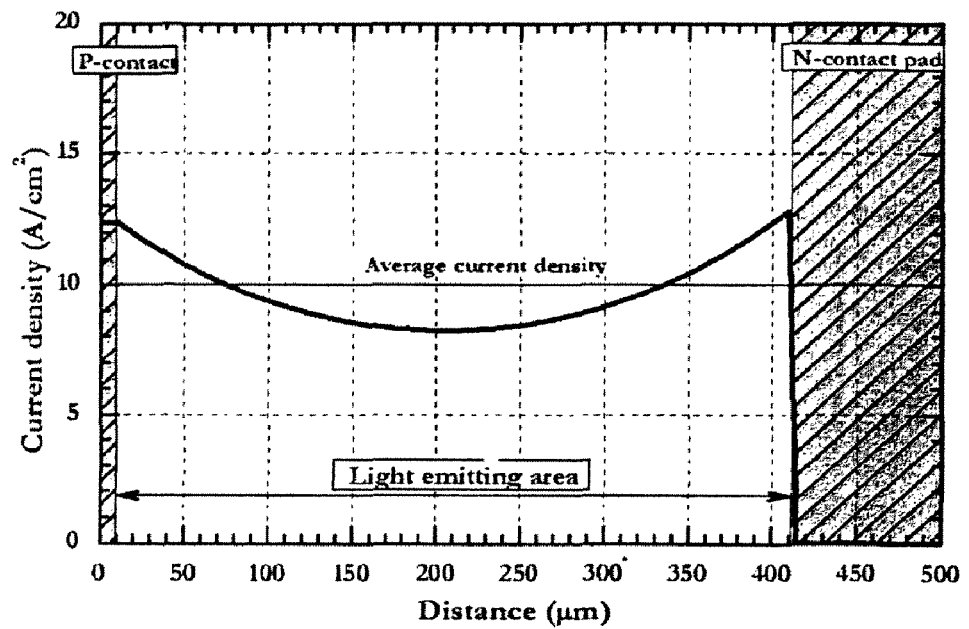

FIG. 1 shows calculated current densities in a linear LED chip with a length of (the upper graph) 200 μm and (the lower graph) 400 μm. The current spreading length in both cases is 200 μm. As is seen in the figure, due to the large horizontal dimensions relative to the current spreading length, current density in both cases is not uniform, uniformity becoming higher with increase of the chip length. One can see that in the second case, current density is far from uniform.

Figure 2:
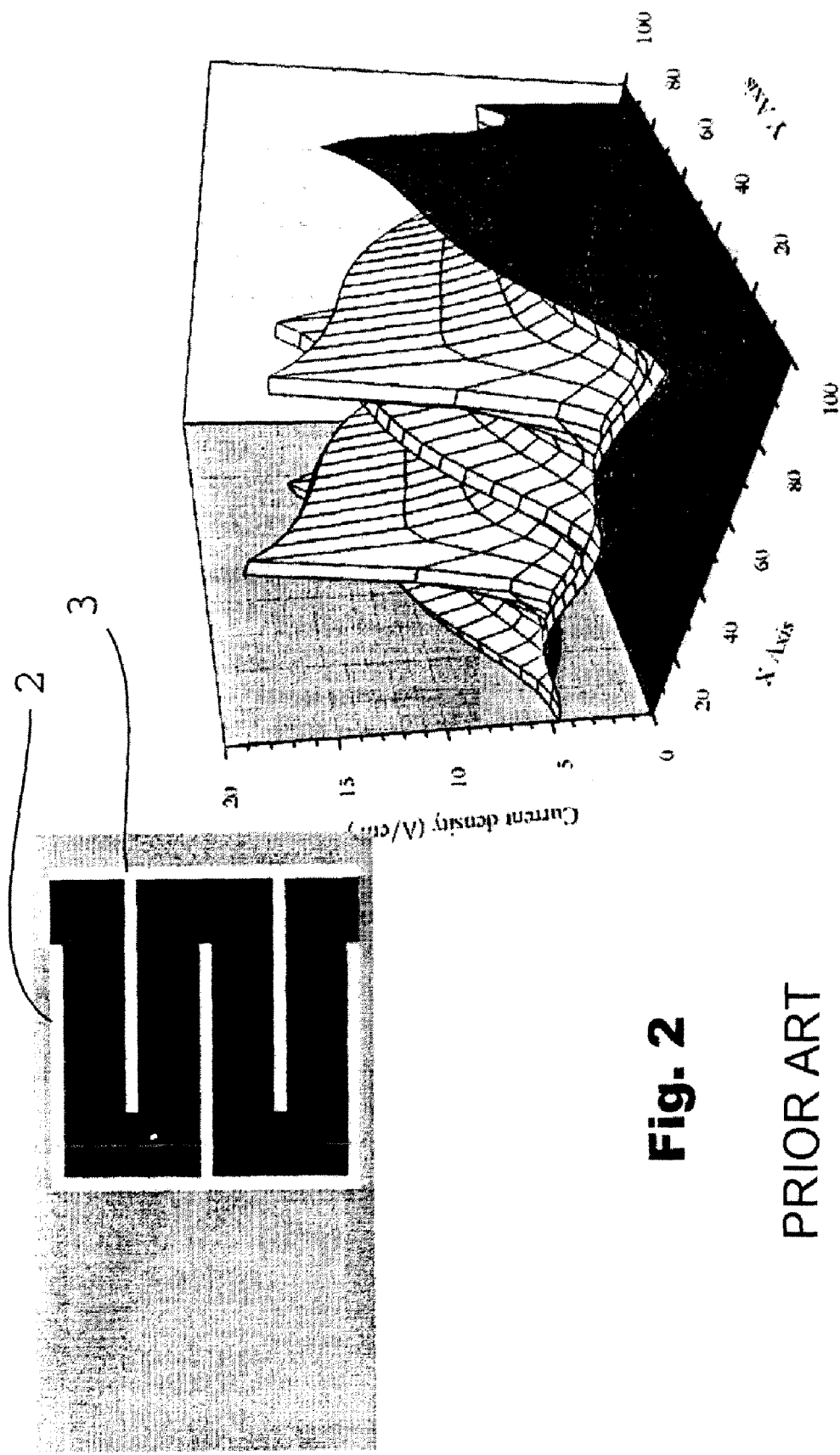
FIG. 2 shows an example of the current dencity in a prior art LED chip utilizing an interdigitated electrode geometry.

The interdigitated electrodes 2, 3 of the LED design of FIG. 2 are arranged to provide a distance between the electrodes smaller than the current spreading length. In spite of this, as is seen in the graph of FIG. 2, the current density over the chip area is highly non-uniform having very strong local maxima at the ends of the finger-like protrusions of the electrodes.

Figure 3:
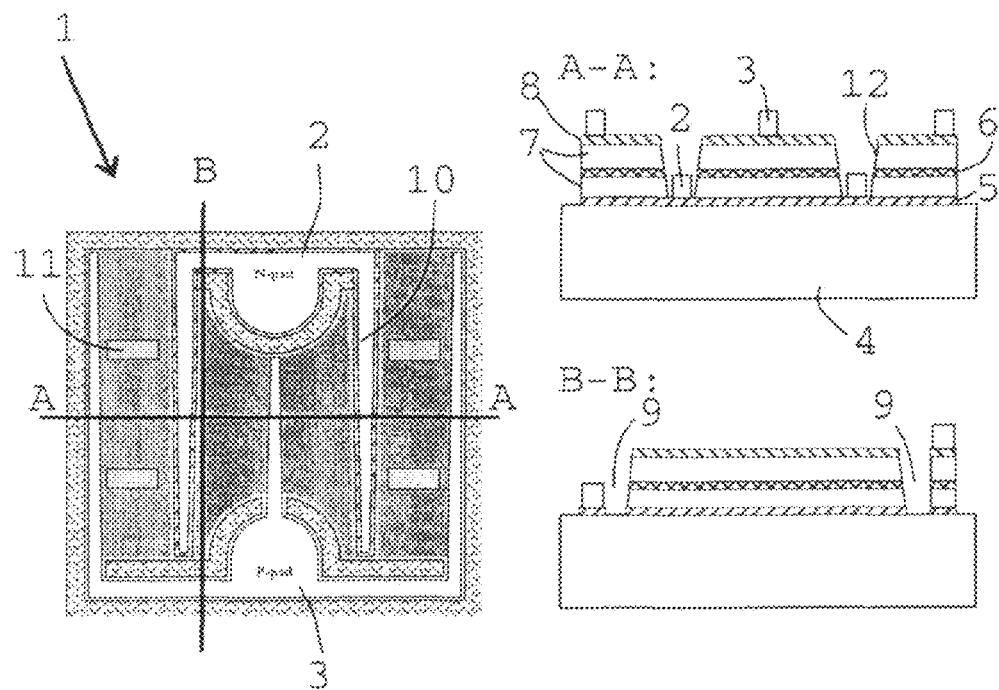
FIG. 3 is a schematic and simplified representation of one embodiment in accordance with the present invention.

In the LED chip 1 of FIG. 3, the first and second electrodes 2, 3 establish a modified interdigitated geometry extending over the entire chip area. Thus, the LED exploits the basic idea of dividing the chip into a number of sections in such a way that the distance between the electrodes is not higher than the current spreading length. This sectioning is illustrated in the cross-sectional views A-A and B-B showing also the layer structure of the chip. The LED is grown on an electrically insulating substrate 4. The lowermost layer on the substrate is a lower current-distributing layer 5. Above this is the light-generating active layer 6 sandwiched between two cladding layers 7 having different types of conductivity. On top of the layer stack is an upper current-distributing layer 8. After growing the layers, the layer stack above the lower current-distributing layer has been selectively etched away in order to expose the lower current distributing layer for forming on it the first electrode 2. The resulted cross section comprises adjacent mesa-like layer stacks lying on the lower current-distributing layer and having the second electrode as the uppermost element.

In addition to the two levels determined by the current-distributing layers, a third chip level has been formed by etching trenches 9 between the electrodes through all layers described above at the sites of the tips of the finger-like protrusions 10 of the electrodes. Thus, the current is prevented from flowing via said tips, which would result in local current density maxima as was shown in FIG. 2. Instead, current can mainly flow only in a direction perpendicular to the parallel "fingers" of the electrodes. This provides a very uniform current density over the entire chip area.

The grooves between the mesa-like layer stacks and the trenches 9 through the chip not only electrically isolate different sections of the chip but also improve light extraction from the chip due to an increased total length of the perimeter of the vertical layer structure and thus an increased probability for light to escape from the chip through the side walls of the vertical layer structure. In order to further enhance the light extraction, there are also additional vertical trenches 11 extending from top of the chip below the active layer. In order to avoid disturbing the current flow, these additional trenches lie along the direction of the horizontal current flow in the current-distributing layers.

Figure 4:
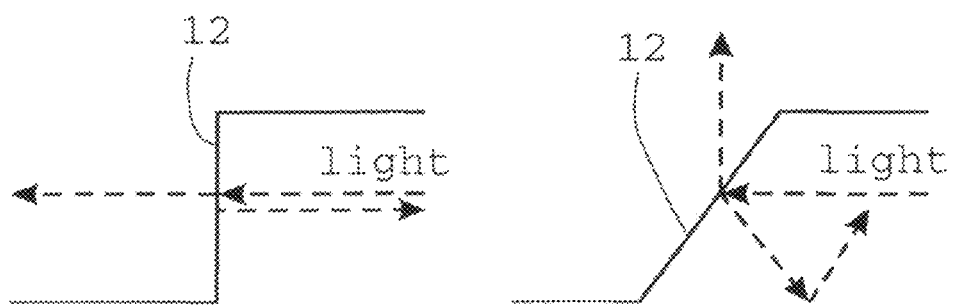
FIG. 4 illustrates the effect of the tilted side walls of the vertical layer structure according to one preferred embodiment of the present invention.

As is seen in FIG. 3, some of the side walls 12 of the vertical layer structure are tilted from the vertical direction to form trench profiles opening upwards. The reason behind this is illustrated in FIG. 4, showing on the left side a trench with vertical side walls and on the right side one having its side walls tilted. In the former case, when escaping horizontally sidewards from the layer structure, the light continues horizontal propagation and can be blocked by the opposite edge of the trench or the first electrode. Instead, in the case of tilted side walls, the light escaping the structure is refracted upwards from the initially horizontal direction and blocking is avoided.

As is clear for a person skilled in the art, the invention is not limited to the examples described above but the embodiments can freely vary within the scope of the claims.

The invention claimed is:

1. An LED chip grown on an electrically insulating substrate, the LED chip comprising a lower current-distributing layer of a first conductivity type, a first electrode, a vertical layer structure, the last two being formed on the lower current-distributing layer horizontally separated from each other, the vertical layer structure comprising an active layer and an upper current-distributing layer of a second conductivity type above the active layer, and a second electrode formed on the upper current-distributing layer, the geometry of the first and second electrodes being adjusted to provide a horizontal distance between the first and second electrodes lower than the current spreading length of the chip, characterized in that a vertical trench is formed between the electrodes, the trench extending through all layers of the chip, including the lower current-distributing layer, for controlling the horizontal current flow in order to achieve a uniform current density over the active layer.

2. An LED chip according to claim 1, characterized in that an additional vertical trench is formed between the electrodes, the additional trench extending through the chip, including the active layer, along the direction of the horizontal current flow in the current-distributing layers for increasing the overall perimeter of the vertical layer structure and thus enhancing the light extraction from the chip.

3. An LED chip according to claim 1, characterized in that a side wall of the vertical layer structure is tilted from the vertical direction for facilitating the light extraction from the chip.

* * * * *

UNITED STATES PATENT AND TRADEMARK OFFICE
CERTIFICATE OF CORRECTION

| | | |
|---|---|---|
| PATENT NO. | : 8,198,648 B2 | Page 1 of 1 |
| APPLICATION NO. | : 12/667330 | |
| DATED | : June 12, 2012 | |
| INVENTOR(S) | : Vladislav E. Bougrov et al. | |

It is certified that error appears in the above-identified patent and that said Letters Patent is hereby corrected as shown below:

Title Page should read:

(75)     Inventors:    Vladislav E. Bougrov
                                 Maxim A. Odnoblyudov Signed and Sealed this
Twenty-third Day of October, 2012

David J. Kappos
*Director of the United States Patent and Trademark Office*